United States Patent
Bayn et al.

(10) Patent No.: US 10,446,699 B2
(45) Date of Patent: Oct. 15, 2019

(54) GERMANIUM PHOTODETECTOR WITH EXTENDED RESPONSIVITY

(71) Applicant: Cisco Technology, Inc., San Jose, CA (US)

(72) Inventors: Igal I. Bayn, New York, NY (US); Sean P. Anderson, Macungie, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/663,556

(22) Filed: Jul. 28, 2017

(65) Prior Publication Data

US 2019/0035948 A1 Jan. 31, 2019

(51) Int. Cl.
| | |
|---|---|
| H01L 31/0232 | (2014.01) |
| H01L 31/028 | (2006.01) |
| H01L 31/0352 | (2006.01) |
| H01L 31/02 | (2006.01) |
| G01S 7/491 | (2006.01) |
| G02B 6/42 | (2006.01) |
| H01L 31/0224 | (2006.01) |
| H01L 31/024 | (2014.01) |
| H01L 31/103 | (2006.01) |

(52) U.S. Cl.
CPC ...... *H01L 31/02325* (2013.01); *G01S 7/4913* (2013.01); *G02B 6/42* (2013.01); *H01L 31/024* (2013.01); *H01L 31/028* (2013.01); *H01L 31/02027* (2013.01); *H01L 31/02327* (2013.01); *H01L 31/022408* (2013.01); *H01L 31/035281* (2013.01); *H01L 31/103* (2013.01)

(58) Field of Classification Search
CPC ......... H01L 31/02325; H01L 31/02027; H01L 31/028; H01L 31/035281; G01S 7/4913
USPC .................................................. 356/432–444
See application file for complete search history.

(56) References Cited

U.S. PATENT DOCUMENTS

| | | | | |
|---|---|---|---|---|
| 4,574,263 | A | * 3/1986 | Liddiard | H01L 37/02 250/338.1 |
| 5,969,341 | A | 10/1999 | Ito et al. | |
| 6,993,236 | B1 | 1/2006 | Gunn, III et al. | |
| 9,583,664 | B2 | 2/2017 | Shi et al. | |
| 2017/0092785 | A1* | 3/2017 | Novack | H01L 27/14 |

* cited by examiner

*Primary Examiner* — Tri T Ton
(74) *Attorney, Agent, or Firm* — Patterson & Sheridan, LLP

(57) ABSTRACT

Embodiments herein describe photonic systems that include a germanium photodetector thermally coupled to a resistive element. Current flowing through the resistive element increases the temperature of the resistive element. Heat from the resistive element increases the temperature of the thermally coupled photodetector. Increasing the temperature of the photodetector increases the responsivity of the photodetector. The bias voltage of the photodetector can be increased to increase the bandwidth of the photodetector. In various embodiments, the photodetector includes at least one waveguide to receive light into the photodetector. Other embodiments include multiple resistive elements thermally coupled to the photodetector.

13 Claims, 8 Drawing Sheets

GERMANIUM PHOTODETECTOR WITH EXTENDED RESPONSIVITY

TECHNICAL FIELD

Embodiments presented in this disclosure generally relate to germanium detectors, and more specifically, to providing a heated resistive element to increase the responsivity of a germanium detector.

BACKGROUND

Silicon-on-Insulator (SOI) optical devices may include an active surface layer that includes waveguides, optical modulators, detectors, CMOS circuitry, metal leads for interfacing with external semiconductor chips, and the like. The active surface can also include photodetectors that convert the light propagating in the waveguides into electrical signals. However, while crystalline silicon is excellent for forming waveguides, silicon is a poor material for generating and absorbing light at wavelengths used for digital communication. While III-V semiconductors are better suited for photo detection and generation, these materials are expensive, their fabrication shows low yield and higher cost as compared to silicon, and, most importantly, their integration into a silicon-on-insulator photonic processing is challenging. One commonly accepted way to bypass the integration problem is by local growth of germanium on a silicon substrate. The detectors made of germanium show high responsivity, bandwidth and low signal-to-noise ratios.

As the complexity and size of communicated data increases there is an increased need for more bandwidth. This is especially true for the long-haul communication where the infrastructure is limited by the discrete number of intercontinental fibers. Though germanium optical detectors are often used for long range communications, the germanium band-gap limits available bandwidth.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
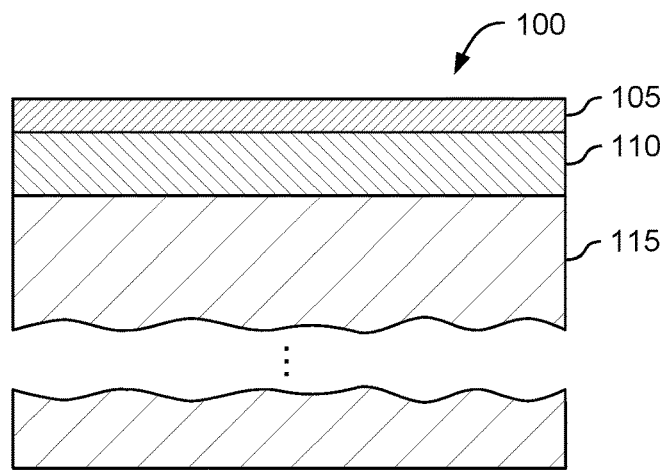
FIG. 1 illustrates a silicon-on-insulator ("SOI") device, according to one embodiment disclosed herein.

One embodiment presented in this disclosure is a photonic system that includes a crystalline silicon substrate that has a waveguide. An optical detector is also included that is optically coupled to the silicon waveguide. The optical detector includes a germanium layer disposed on the silicon substrate and a plurality of electrical contacts contacting at least one of the silicon substrate and the germanium layer. A resistive element is thermally coupled to the optical detector such that a current flowing through the resistive element affects a temperature of the optical detector.

In yet another embodiment described herein, a method is provided for adjusting the temperature of an optical detector. The method includes applying current to at least one resistive element that is thermally coupled to an optical detector. The applied current, through the at least one resistive element, is increased when an operating parameter is below a threshold value. The method decreases the applied current, through the at least one resistive element, when the operating parameter is above a threshold value.

In another embodiment described herein a photonic system includes a crystalline silicon substrate. The crystalline silicon substrate includes at least one waveguide. The waveguide includes silicon or silicon nitride. The system also includes an optical detector optically coupled to the at least one waveguide. The optical detector includes a germanium layer disposed on the silicon substrate. At least one resistive element is thermally coupled to the optical detector such that a current flowing through the resistive element controls a temperature of the optical detector.

EXAMPLE EMBODIMENTS

The embodiments of the present disclosure describe a photonic device that includes a germanium photodetector. Germanium detectors have a bandgap that can cause significant responsivity degradation at longer wavelengths. For example, at 1565 nm the responsivity of the germanium detector is reduced by about 38% relative to the responsivity of the detector at about 1500 nm. This degradation is more severe for the L-band which spans a wavelength range of about 1565 to about 1625 nm. To increase responsivity, the germanium detectors described herein are thermally coupled to a resistive element. The current flowing through the resistive element can be controlled to determine the amount of heat generated by the resistive element. Because the germanium detector is thermally coupled to the resistive element, the heat generated by the resistive element affects the temperature of the germanium grown; thus, modulating the bad-gap of the germanium and thus the responsivity of the detector. For example, increasing the temperature of the germanium detector increases the responsivity of the detector—i.e., reduces the degradation of the responsivity. However, increasing the temperature of the germanium detector can cause a drop in bandwidth. To compensate for the loss in bandwidth, in one embodiment, the bias voltage of the germanium detector is increased.

FIG. 1 illustrates an SOI device 100, according to one embodiment disclosed herein. SOI device 100 includes a surface layer 105, a buried insulation layer 110 (also referred to as buried oxide ("BOX") layer), and a semiconductor substrate 115. Although the embodiments herein refer to the surface layer 105 and substrate 115 as silicon, the disclosure is not limited to such. For example, other semiconductors or optically transmissive materials may be used to form the SOI device 100 shown here. Moreover, the surface layer 105 and the substrate 115 may be made of the same material, but in other embodiments, these layers 105, 115 may be made from different materials.

The thickness of the surface layer 105 may range from less than 100 nanometers to greater than a micron. More specifically, the surface layer 105 may be between 1 nanometer to a few microns thick. The thickness of the insulation layer 110 may vary depending on the desired application. In one embodiment, the thickness of insulation layer 110 may range from less than one micron to tens of microns. The thickness of the substrate 115 may vary widely depending on the specific application of the SOI device 100. For example, the substrate 115 may be the thickness of a typical semiconductor wafer (e.g., 100-700 microns) or may be thinned and mounted on another substrate.

For optical applications, the surface layer 105 and insulation layer 110 (e.g., silicon dioxide, silicon oxy-nitride, and the like) may provide contrasting refractive indexes that vertically confine an optical signal in a silicon waveguide in the surface layer 105. In a later processing step, the surface layer 105 of the SOI device 100 may be etched to form one or more silicon waveguides; thus forming lateral confinement. Because silicon has a higher refractive index compared to an insulator such as silicon dioxide, the optical signal remains primarily in the waveguide as it propagates across the surface layer 105.

Figure 2:
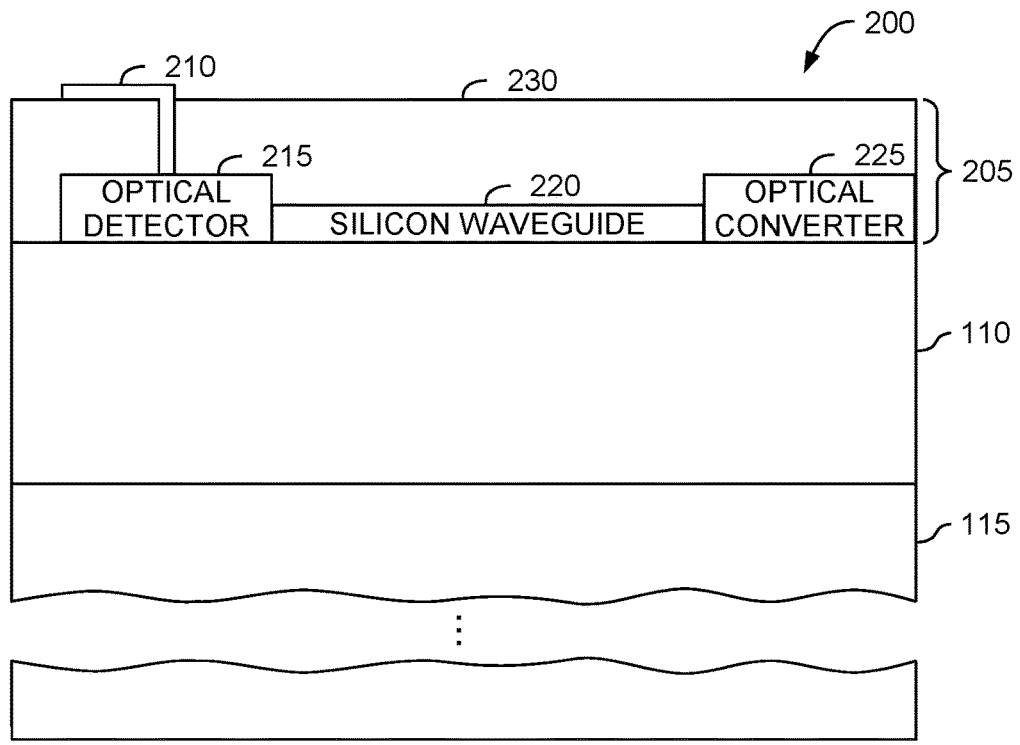
FIG. 2 illustrates an SOI device with an optical detector coupled to a silicon waveguide, according to one embodiment disclosed herein.

FIG. 2 illustrates a SOI device 200 with an optical detector 215 coupled to a silicon waveguide 220, according to one embodiment disclosed herein. Like the SOI device 100 in FIG. 1, SOI device 200 includes a surface layer 205, insulation layer 110, and substrate 115. However, the surface layer 205 has been processed to include various optical components that may be used in an optical device. For example, surface layer 205 includes an optical detector 215 with a metal lead 210. "Optical detector," "detector," "germanium detector," "photodetector" are used interchangeably in this document. The detector 215 may be formed by performing various fabrication steps on the silicon substrate such as etching or doping the silicon material as well as depositing or growing or implanting additional materials onto surface layer 205 such as germanium. Metal lead 210 represents any number of traces or contacts that can be used to transmit electrical signals generated by the optical detector 215. For example, the optical detector 215 may have n-type and p-type doped regions coupled to respective metal leads 210 for generating or transmitting signals that correspond to the absorbed optical signal passing through the waveguide 220. Although not shown, the metal lead 210 may be connected to an integrated circuit mounted onto the SOI device 200 that receives and processes the electrical signals generated by the optical detector 215. In another embodiment, the integrated circuit may be physically separate from the SOI device 200 but coupled to the metal lead 210 via a bond wire.

The silicon waveguide 220 may have been fabricated from a silicon surface layer (e.g., layer 105 of FIG. 1). SOI device 200 may use waveguide 220 to carry an optical signal to different areas of the surface layer 205. In this example, the silicon waveguide 220 transmits optical signals received from an optical converter 225 to the optical detector 215, but in other examples, the silicon waveguide 220 may receive the optical signals from other components in the SOI device 200. In various embodiments, the waveguide is made of a material that includes silicon, polysilicon, silicon nitride, silicon oxy-nitride or some other material suitable for optical waveguides.

In addition to including components made from silicon, surface layer 205 may include other components which may be made from other materials (e.g., a germanium detector 215) or a combination of silicon with other materials. The other materials may be deposited or grown on surface layer 205 using any suitable fabrication techniques. Once the surface layer 205 is processed to include the desired components, the components may be covered with a protective material 230 (e.g., an electrical insulative material) which may serve as a suitable base for mounting additional circuitry on the SOI device 200. In this manner, the silicon surface layer 205 of SOI device 200 may be processed using any number of techniques to form a device for performing a particular application such as optical modulation, detection, amplification, generating an optical signal, and the like.

Surface layer 205 also includes the optical converter 225 coupled to the silicon waveguide 220. As shown, one interface of the optical converter 225 is coupled to the waveguide 220 while another interface is proximate to an outer or external surface of the SOI device 200. Although the optical converter 225 is shown as being exposed on the outer surface of the device 200, in other embodiments the converter 225 may be recessed slightly from the outer surface. In one embodiment, the converter 225 may be made of the same material as the waveguide 220. For example, the converter 225 and waveguide 220 may both be made of silicon. In one embodiment, the converter 225 may include a plurality of stacked layers that are processed (e.g., etched) such that an optical signal striking the exposed surface of the converter is focused into the waveguide 220. The converter may couple light from the side or top or bottom surfaces of 200 into the waveguide.

The optical converter 225 may be designed to efficiently couple to an external light-carrying medium. Because the dimensions of the waveguide 220 may result in high optical losses if directly connected to an external light-carrying medium, the light-carrying medium may instead be coupled to the converter 225 which then transfers the signal into the silicon waveguide 220. Doing so may eliminate the need for using lenses between the external light-carrying medium and the waveguide 220 which focus the optical signal into a mode with a diameter similar to the dimensions of the waveguide 220. Stated differently, in one embodiment, the converter 225 may permit the external light-carrying medium to transmit light directly into SOI device 200 without the addition of external focusing elements such as lenses.

Figure 3:
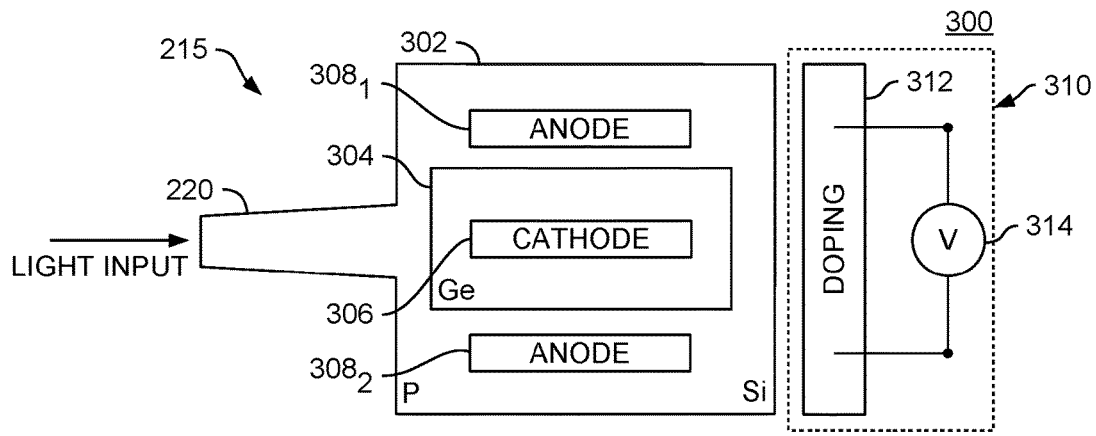
FIG. 3 illustrates an SOI device with an optical detector thermally coupled to a resistive element, according to one embodiment disclosed herein.

FIG. 3 illustrates a top view of an example system 300 that includes a germanium optical detector 215 and heating subsystem 310 according to one embodiment disclosed herein. The system 300 may be fabricated in the device layer of an SOI (not shown). The heating subsystem 310 can control the temperature of the optical detector 215 and change the responsivity of the optical detector 215. When etching the system 300, a portion of silicon can be removed so that there is a space between the optical detector 215 and a resistive element 312; or alternatively, material can be added to a substrate (not shown) to add material for the optical detector 215 and for the heating subsystem 310. As an example of the former, a portion of the silicon substrate is etched away leaving a small space separating what will eventually be processed to become the optical detector 215 and the heating subsystem 310. The space is eventually filled with spacer material that is different than crystalline silicon. In various embodiments, the space is less than a micron.

The optical detector 215 includes germanium layer 304 disposed on a silicon substrate 302. In FIG. 3, the optical detector 215 includes two metal contacts 308$_1$ and 308$_2$ (collectively "metal contacts 308") that contact the top surface of the silicon substrate 302. A metal contact 306 is in contact with the germanium layer 304. In this embodiment, the silicon waveguide 220 extends towards the germanium layer 304 and terminates at the silicon substrate 302. The waveguide 220 transmits light underneath the germanium layer 304 in a direction illustrated by the arrow. The light carried by the waveguide 220 is index coupled through the silicon substrate 302 up into the germanium layer 304 where the light is absorbed and results in charge carriers (e.g., hole and electron pairs) in the germanium layer 304.

Various embodiments of the substrate 302 and/or germanium layer 304 can have geometric shapes other than those shapes described throughout this document. For example, some embodiments described herein utilize a substrate 302 and/or a germanium layer 304 that has a polygon shape. A "polygon" as used herein is defined as a shape made of substantially straight lines that are connected so that the shape is closed. Examples of polygon shapes that can be used in embodiments of the material described herein are squares, rectangles, triangles, pentagons, hexagons, N-vertex, etc.

In addition, various embodiments of the substrate 302 and/or germanium layer 304 can have the shape of a "closed-plane curve." A "closed-plane curve" as used herein is defined as a line that is bent around until its ends join together. Examples of closed-plane curves are circles, ellipse, ovals, etc.

Some embodiments include features that are "symmetrical" and/or other features that are "asymmetrical." "Symmetrical" as used herein is defined as having similar parts facing each other or around the X− axis. "Asymmetrical" as used herein is defined as having parts that lack symmetry by having parts that fail to correspond to one another in shape, size, or arrangement around the X− axis. For example, when multiple silicon bridges (described below as silicon bridges 702) and/or waveguides 220 are included those bridges 702 or waveguides 220 can be symmetrically and/or asymmetrically positioned on the substrate 302.

In various embodiments described herein and depicted in the figures, the metal contacts 308 are depicted as anodes, while the metal contact 306 on the germanium 304 is depicted as a cathode. In each of the embodiments, the location of the anodes 308 is interchangeable with the location of the cathode 306. Generally, the metal contacts 306 and 308 generate an electric field that collects the electron and hole pairs generated when the light transmitted by the waveguide 220 is absorbed by the germanium layer 304. The current corresponding to the metal contacts 306 and 308 can be measured to determine optical characteristics (e.g., power, polarization etc.) of the light transmitted by the waveguide 220.

The heating subsystem 310 includes a resistive element 312 coupled to a control circuit 314. Illustratively, the control circuit 314 is depicted as a voltage source. In one embodiment, the control circuit 314 is disposed on the same chip as the optical detector 215. In another embodiment, the control circuit 314 is disposed on a different chip than the optical detector 215. For example, the control circuit 314 may be disposed on an electrical integrated circuit that is electrically connected to bond pads on the photonic chip containing the optical detector 215. Because the resistance of the resistive element 312 is correlated to the temperature of the resistive element 312, the temperature of the resistive element 312 can be adjusted by monitoring the resistance of the resistive element 312 and adjusting the current through the resistive element 312. The control circuit 314 sends current through the resistive element 312 to adjust the temperature and resistance of the resistive element 312 accordingly. When an increased current causes the temperature of the resistive element 312 to increase, the proximity of the resistive element 312 to the detector 215 causes an increase in temperature in the detector 215. The reverse is also true where decreased current results in the resistive element 312 generating less heat which may reduce the temperature of the detector 215. The resistance of the resistive element 312 can be adjusted by adjusting the current through the resistive element 312 and measuring the voltage across the resistive element 312 to calculate the resistance of the resistive element 312. In one embodiment, dopants are implanted into the silicon to form the resistive element 312. Controlling the location and density of the dopants can set the desired resistance of the resistive element 312.

The resistive element 312 herein is described as having "operating parameters" (also referred to herein as "parameters"). "Operating parameters" are defined herein as voltage across the resistive element 312 with a given current through the resistive element 312; a targeted resistance of the resistive element 312 at a given voltage across the resistive element 312 and/or current through the resistive element 312; and/or temperature of the resistive element 312 at a given resistance, voltage and/or current. In various embodiments, the operating parameters are stored in a look-up table (not shown).

An increase in temperature of the detector 215 increases the responsivity of the detector 215. For illustrative purposes only, references to temperature herein are described in degrees Celsius. "Responsivity" as used herein is defined as the electrical current output per the optical input of the photodetector.

Although increasing the temperature of a germanium detector increases the detectors responsivity, increasing the temperature also reduces the bandwidth of the detector. Although temperature increases reduce the bandwidth of germanium detectors, the reduced bandwidth can be compensated for (i.e., increased) by increasing the bias voltage. In each of the embodiments described herein, the bias voltage can be increased to compensate for the loss in bandwidth due to temperature increases in the detector 215. In each of the embodiments described herein the bias voltage can be increased by increasing the voltage across the anode 308 and cathode 306 contacts.

Figure 4:
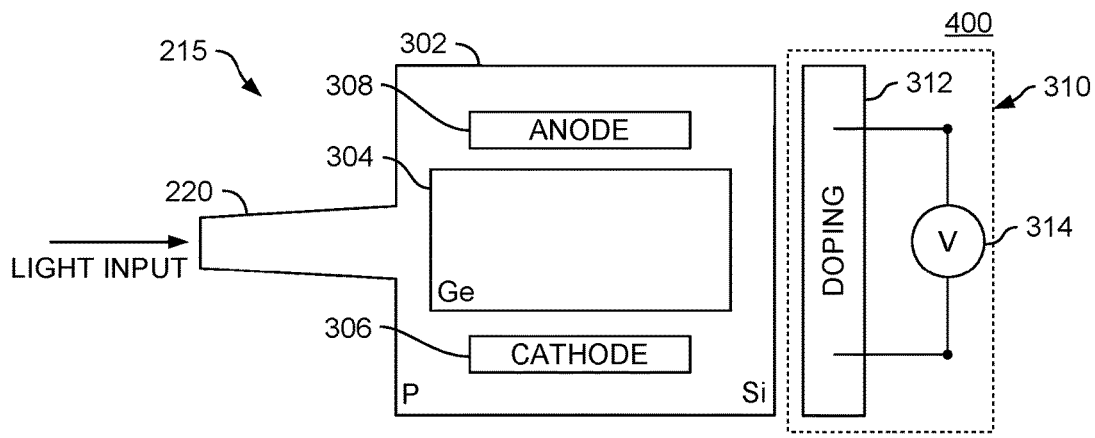
FIG. 4 illustrates an SOI device with an optical detector thermally coupled to a resistive element, according to one embodiment disclosed herein.

FIG. 4 illustrates a top view of an example of a system 400 that includes the germanium optical detector 215 and heating subsystem 310 according to one embodiment disclosed herein. The system 400 is similar to the system 300 described above and depicted in FIG. 3 except that in system 400 the electrical contacts (anode 308 and cathode 306) are in the silicon substrate 302.

Figure 5:
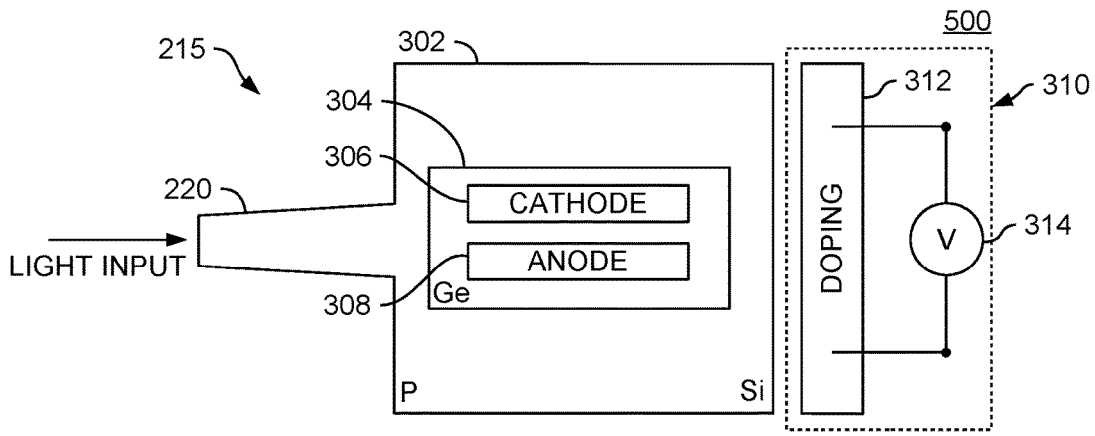
FIG. 5 illustrates an SOI device with an optical detector thermally coupled to a resistive element, according to one embodiment disclosed herein.

FIG. 5 illustrates a top view of an example of a system 500 that includes the germanium optical detector 215 and heating subsystem 310 according to one embodiment disclosed herein. The system 500 is similar to the system 300 described above and depicted in FIG. 3 except that in system 500 the electrical contacts (anode 308 and cathode 306) are in the germanium layer 304.

This document describes various configurations of SOI devices. Some of the other configurations of SOI devices that can be used are described in U.S. patent application Ser. No. 15/440,209, filed on Feb. 23, 2017 and entitled "GERMANIUM MULTI-DIRECTIONAL DETECTOR." This document incorporates by reference all of the material in U.S. patent application Ser. No. 15/440,209, filed on Feb. 23, 2017 and entitled "GERMANIUM MULTI-DIRECTIONAL DETECTOR."

Figure 6:
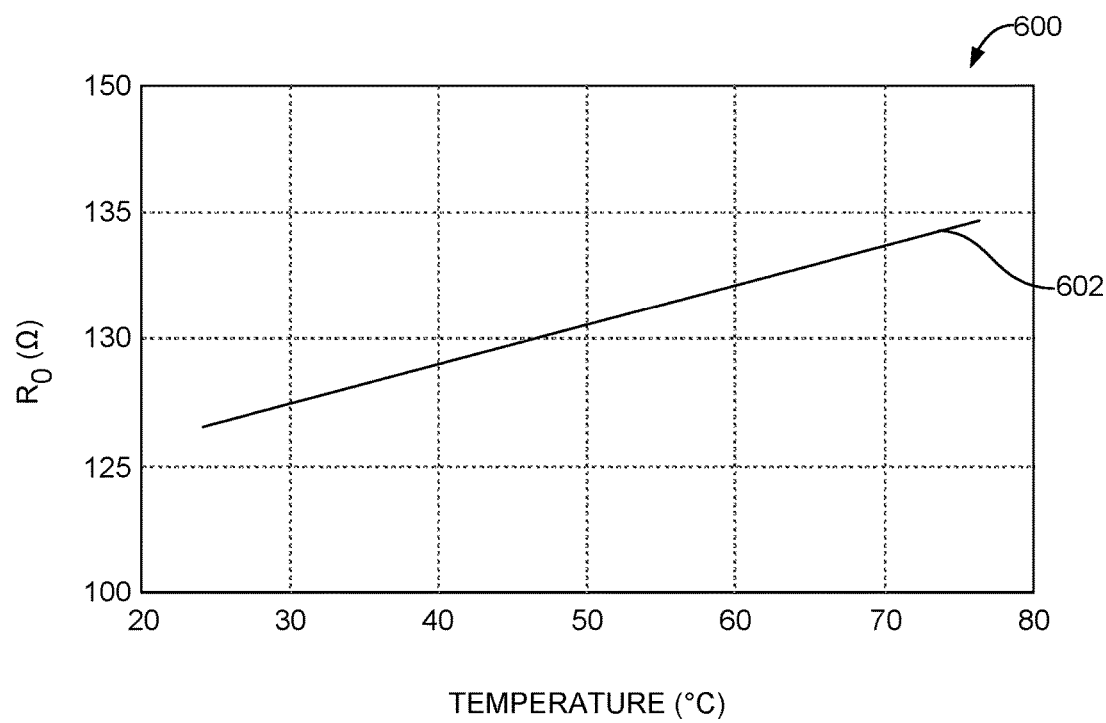
FIG. 6 illustrates an example graph that shows that there is an increase in resistance in response to an increase in temperature.
Figure 7:
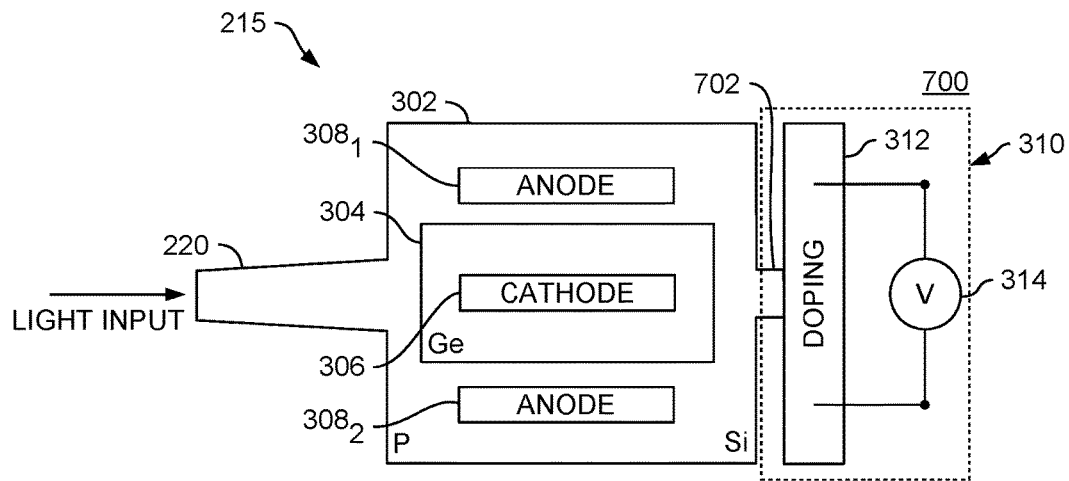
FIG. 7 illustrates an SOI device with an optical detector thermally coupled to a resistive element, according to one embodiment disclosed herein.

FIG. 6 is a chart 600 that includes a plot 602 illustrating an increase in the resistance of the resistive element 312 relative to a temperature increase in the resistive element 312. FIG. 7 illustrates a top view of a photonic system 700 with an optical detector 215 thermally coupled to a heating subsystem 310, according to one embodiment disclosed herein. During the etching process for the photonic system 700, a portion of the silicon substrate 302 has been etched away to define an area occupied by the optical detector 215 and the resistive element 312. During the etching process, a portion of the silicon substrate is left to form a silicon bridge 702 that couples the resistive element 312 to the optical detector 215. One silicon bridge 702 is shown in FIG. 7 for illustrative purposes only. In various embodiments, system 700 includes multiple bridges 702. In each of the embodiments described herein the width of the bridge 702 can be a few nanometers to several microns.

Figure 8:
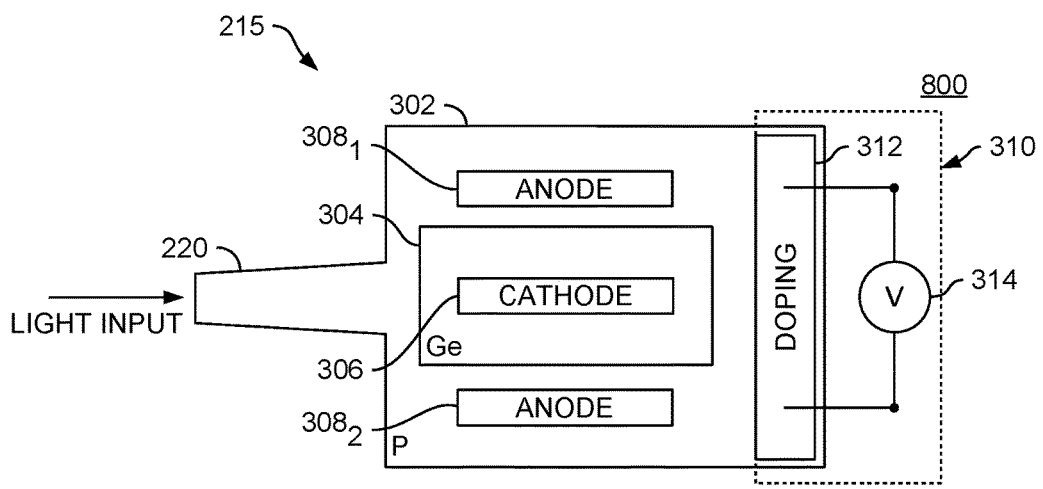
FIG. 8 illustrates an SOI device with an optical detector thermally coupled to a resistive element, according to one embodiment disclosed herein.

FIG. 8 illustrates a top view of a photonic system 800 with the optical detector 215 thermally coupled to the heating subsystem 310, according to one embodiment disclosed herein. In system 800, the resistive element 312 is on the silicon substrate 302. Placing the resistive element 312 on the silicon substrate 302 provides better thermal coupling to the germanium layer 304 than some of the other embodiments disclosed herein. The resistive element 312, in some instances, has a voltage gradient that can be monitored so that it does not interfere with the operation of the detector 215. For example, the diode and the resistive element 312 may be negatively biased with a minimal increase in dark current to minimize interference by the dark current with the operation of the detector 215.

Figure 9:
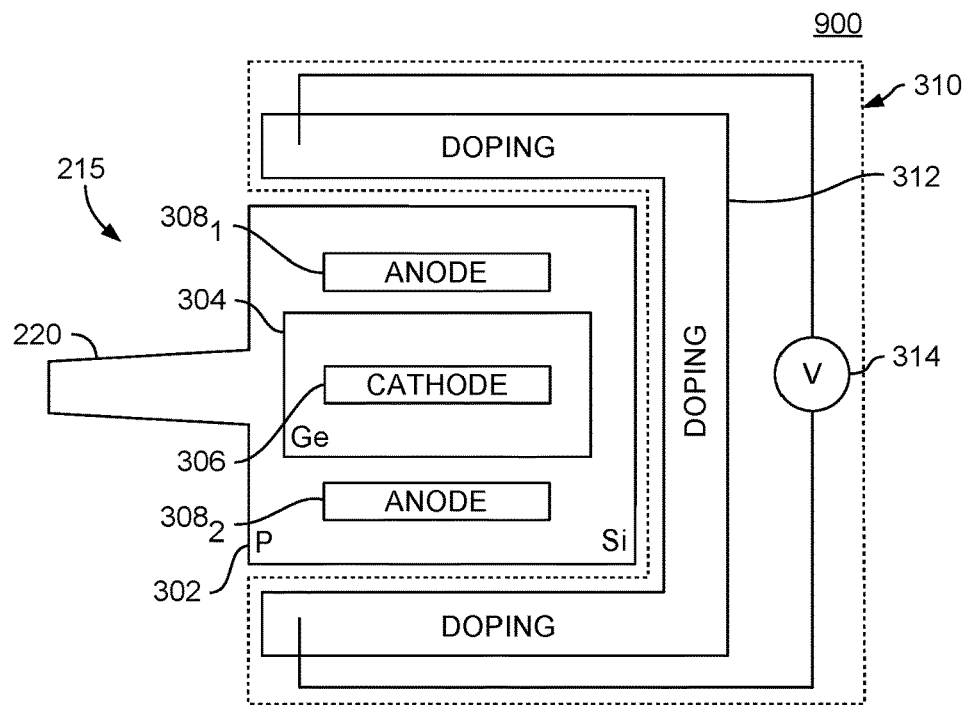
FIG. 9 illustrates an SOI device with an optical detector thermally coupled to a resistive element, according to one embodiment disclosed herein.

FIG. 9 illustrates a top view of a photonic system 900 with the optical detector 215 thermally coupled to the heating subsystem 310, according to one embodiment disclosed herein. In system 900, the heating subsystem 310 includes a resistive element 312 that has been etched from the silicon substrate 302 so that the silicon substrate 302 has a geometry that includes opposite sides that are parallel to each other. When etching a base layer, for system 900, the resistive element 312 includes multiple sides that are adjacent to three sides of the silicon substrate 302 and germanium layer 304. However, in another embodiment, the resistive element 312 includes sides that are adjacent to only two of the sides of the silicon substrate 302 or sides that are adjacent to four of the sides of the silicon substrate 302.

A space is etched between the multiple sides of the resistive element 312 and the adjacent sides of the silicon substrate 302 so that the resistive element 312 and silicon substrate are not touching. In one embodiment, a filler material (e.g., different than crystalline silicon) is disposed in the space. FIG. 9 illustratively depicts the resistive element 312 as positioned adjacent to three sides of the silicon substrate 302 and the germanium layer 304. In addition, FIG. 9 also depicts the resistive element 312 as one contiguous resistor. However, in various embodiments the resistive element 312 includes multiple resistors—e.g., an individually controllable resistive element 312 disposed at each one of the three sides or an individually controllable resistive element 312 on at least one of the three sides.

Figure 10:
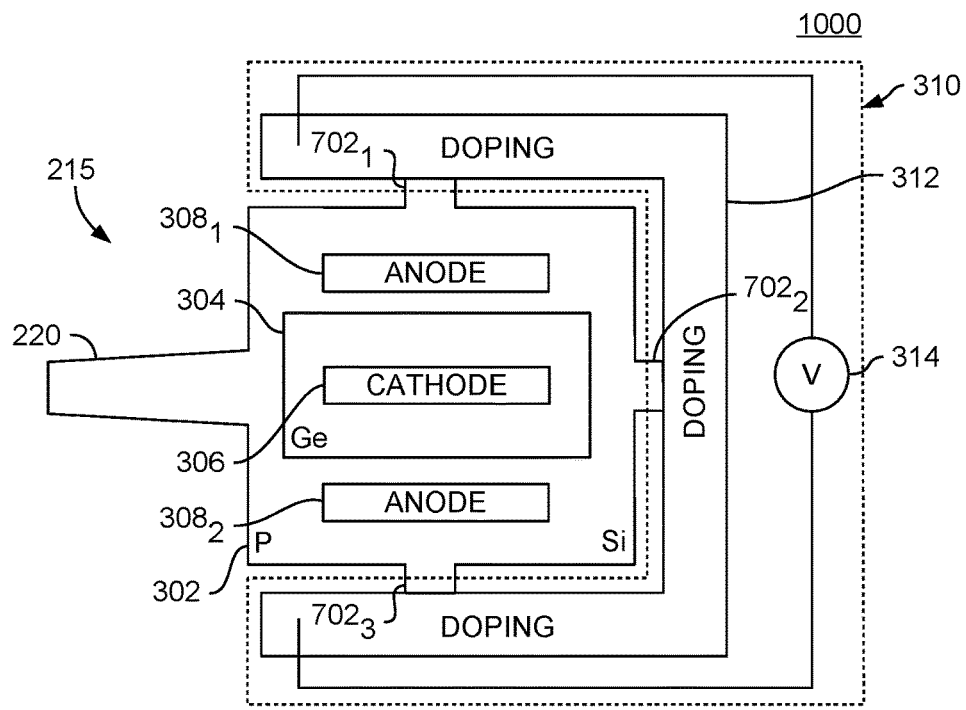
FIG. 10 illustrates an SOI device with an optical detector thermally coupled to a resistive element, according to one embodiment disclosed herein.

FIG. 10 illustrates a top view of a photonic system 1000 with the optical detector 215 thermally coupled to the heating subsystem 310, according to one embodiment disclosed herein. The photonic system 1000 is similar to the photonic system 900 described above however, the system 1000 includes multiple silicon bridges $702_1$, $702_2$ and $702_3$ (collectively "silicon bridges 702"). In the system 1000, each silicon bridge 702 couples a side of the resistive element 312 to an adjacent side of the silicon substrate 302. In various embodiments, the resistive element 312 includes multiple resistors—e.g., resistive elements 312 that are individually controllable and disposed at each one of the three sides.

Figure 11:
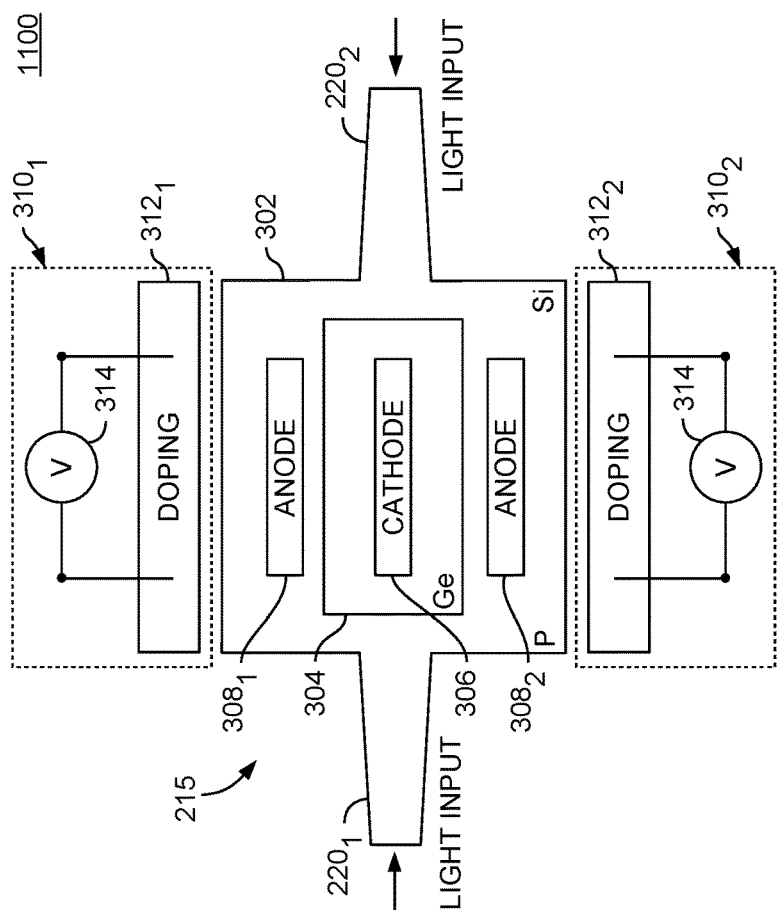
FIG. 11 illustrates an SOI device with an optical detector thermally coupled to a resistive element, according to one embodiment disclosed herein.

FIG. 11 illustrates a top view of a photonic system 1100 with the optical detector 215 thermally coupled to heating subsystems, according to one embodiment disclosed herein. The photonic system 1100 is similar to the photonic system 300 described above and illustrated in FIG. 3. However, the photonic system 1100 further includes multiple waveguides depicted as waveguide $220_1$ and $220_2$. Waveguides $220_1$ and $220_2$ operate similarly to the waveguide 220 described with respect to photonic system 300. The photonic system 1100 also includes two heating subsystems $310_1$ and $310_2$ in contrast to the one heating subsystem 310 described in photonic system 300 and illustrated in FIG. 3. In an embodiment, the control circuit 314 controls heating subsystems $310_1$ and $310_2$. Heating subsystem $310_1$ also includes resistive element $312_1$ and heating subsystem $310_2$ includes resistive element $312_2$. The heating subsystems $310_1$, $310_2$ are positioned between the waveguides $220_1$, $220_2$; and are on opposite ends of the detector 215. In one embodiment, the heating subsystems 310₁, 310₂ are independently controllable such that they have different currents/voltages (using the same control circuit 314 or different and independent control circuits 314). In another embodiment, the heating subsystems 310₁, 310₂ are controlled by the same control circuit 314 so that the voltage drop across the heating subsystems 310₁, 310₂ is the same.

Figure 12:
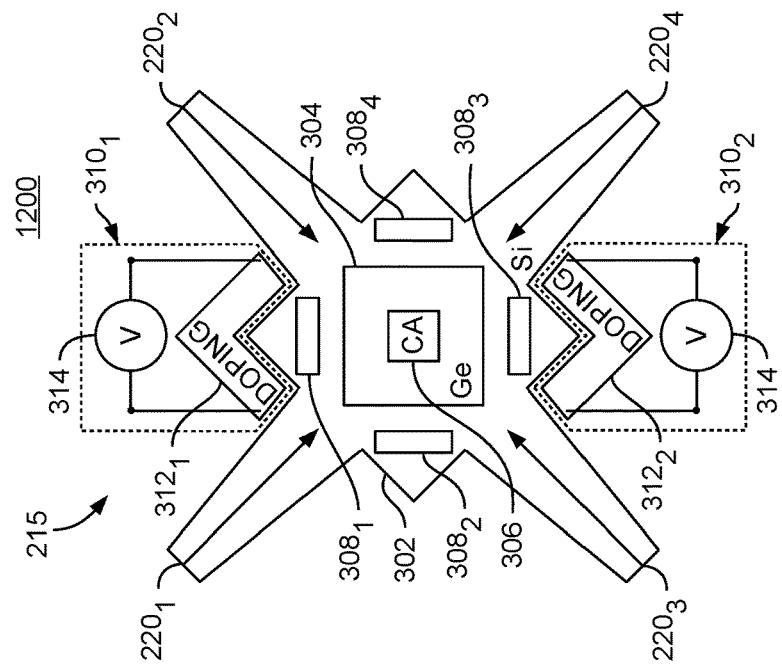
FIG. 12 illustrates an SOI device with an optical detector thermally coupled to a resistive element, according to one embodiment disclosed herein.

FIG. 12 illustrates a top view of a photonic system 1200 with the optical detector 215 thermally coupled to heating subsystems 310, according to one embodiment disclosed herein. As shown in FIGS. 3 and 7-11, the silicon substrate 302 has the shape of a polygon that includes four sides that form four corners. Although photonic system 1200 includes the silicon layer 302 as described above with respect to FIGS. 3 and 7-11, the arrangement of other components on the silicon substrate 302 is different in photonic system 1200. For example, the photonic system 1200 includes four optical waveguides 220₁, 220₂, 220₃, and 220₄ (collectively "optical waveguides 220") symmetrically arranged on the sides of the silicon substrate 302.

Each of the waveguides 220 extends in a direction as illustrated by the arrows when approaching the germanium layer 304. The germanium layer 304, in system 1200, is rotated (45 degrees with respect to the germanium layers shown in FIGS. 3 and 7-11) so that corners of the germanium layer 304 align with the waveguides 220. In other words, the waveguides 220 extend in a direction that is offset 45 degrees relative to the two sides of the germanium layer 304 forming the corners. The waveguides 220 are optically coupled to respective corners of the germanium layer 304 via the silicon substrate 302. Instead of extending in a direction perpendicular to one of the sides of the germanium layer 304, the waveguides 220 are offset from the sides of the germanium layer 304. Thus, the waveguides 220 are not perpendicular or parallel to any side of the germanium layer 304 but rather transmit light in a direction that is offset from a direction perpendicular or parallel to the surfaces of the germanium layer 304.

In addition to electrical contact 306 on the germanium layer 304, system 1200 also includes four electrical contacts 308₁; 308₂; 308₃; and 308₄ (collectively "electrical contacts 308"). Each of the electrical contacts 308 is symmetrically arranged near the corners of the silicon substrate 302. Also near two of the corners of the silicon substrate 302 are two heating subsystems 310₁ and 310₂. Heating subsystem 310₁ also includes resistive element 312₁ and heating subsystem 310₂ includes resistive element 312₂. In an embodiment, the control circuit 314 controls each of the resistive elements 312₁ and 312₂ in heating subsystems 310₁ and 310₂, respectively. In various embodiments, system 1200 includes at least one silicon bridge. For illustrative purposes only, system 1200 is described herein and depicted in FIG. 12 as including two resistive elements 312. However, in various embodiments, system 1200 includes a different number of resistive elements 312 (i.e., one, two or four resistive elements 312).

Figure 13:
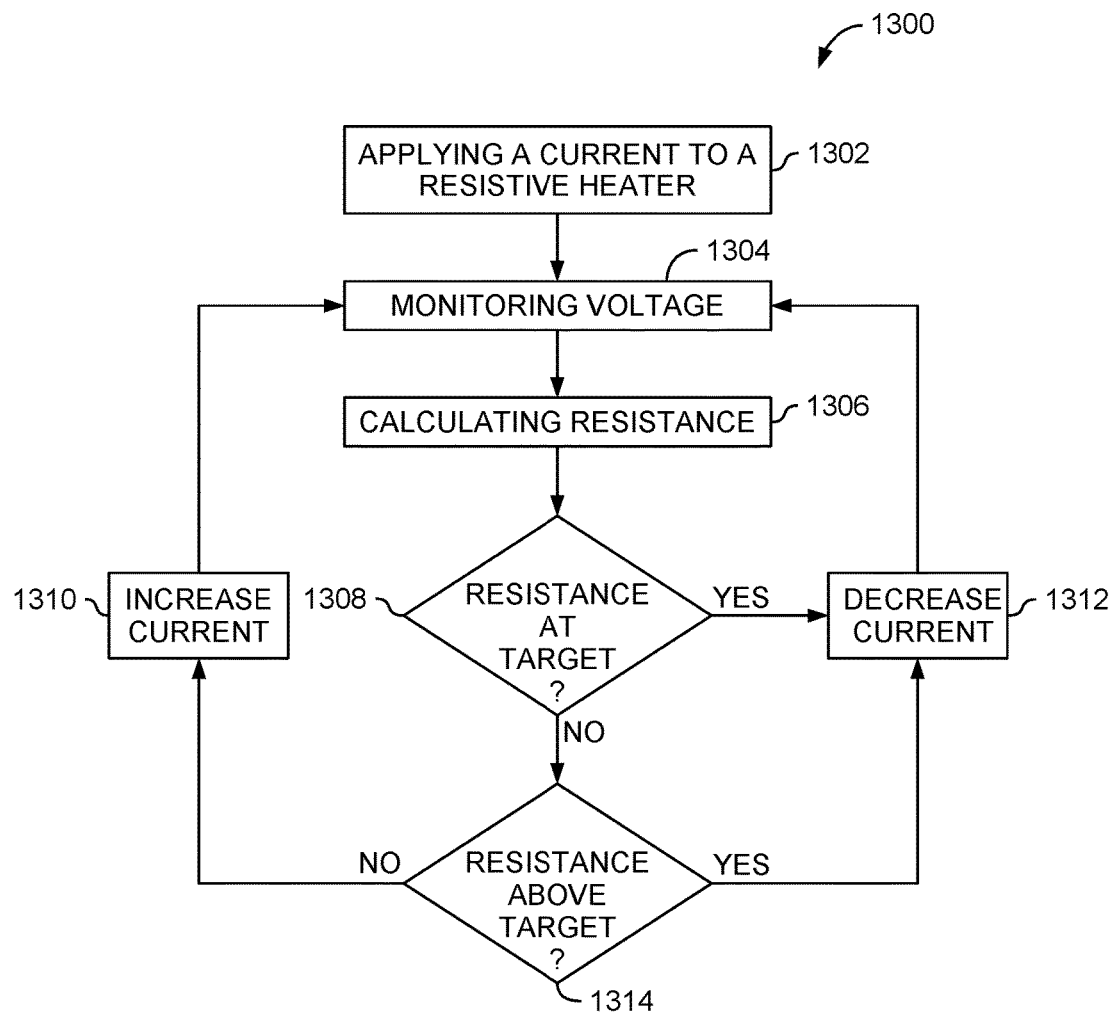
FIG. 13 illustrates a method of monitoring and adjusting resistance in the resistive element thermally coupled to the optical detector, according to one embodiment disclosed herein.

FIG. 13 illustrates a method 1300 of monitoring and adjusting resistance in the resistive element 312 thermally coupled to the optical detector 215, according to one embodiment disclosed herein. The resistance of the silicon substrate 302 is temperature dependent. The control circuit 314 applies a current to the resistive element 312 at block 1302 while at the same time monitoring the voltage drop in the resistive element 312 at block 1304. Using the monitored voltage drop and the current, the resistance of the resistive element 312 is calculated.

At block 1308, the calculated resistance is compared to a target resistance. The "target resistance" is defined as a resistance that is correlated with a desired temperature of the detector 215 that improves responsivity without sacrificing dark current and/or bandwidth response.

If the calculated resistance is the same as the target resistance, then at block 1312 the control circuit 314 monitors the voltage drop of the resistive element 312 at block 1304. The control circuit 314 performs blocks 1304, 1306 and 1308 as already described. Blocks 1308, 1304 and 1306 act as an iterative loop that maintains the resistance of the resistive element 312 at the same resistance as the target resistance. If however, the calculated resistance is different than the target resistance, the control circuit 314 proceeds towards block 1314 to determine whether the calculated resistance is above the target resistance.

If the calculated resistance is above the target resistance, then at block 1312 the control circuit 314 reduces the current through the resistive element 312. After block 1312, the control circuit 314 performs blocks 1304, 1306, 1308, and 1314 as already described. Blocks 1312, 1304, 1306, 1308, and 1314 act as an iterative loop that decreases the temperature of the resistive element 312 and the thermally coupled detector 215.

If the calculated resistance is below the target resistance, then at block 1310 the control circuit 314 increases the current through the resistive element 312. After block 1310, the control circuit 314 performs blocks 1304, 1306, 1308, and 1314 as already described. Blocks 1310, 1304, 1306, 1308, 1314 act as an iterative loop that increases the temperature of the resistive element 312 and the thermally coupled detector 215.

Figure 14:
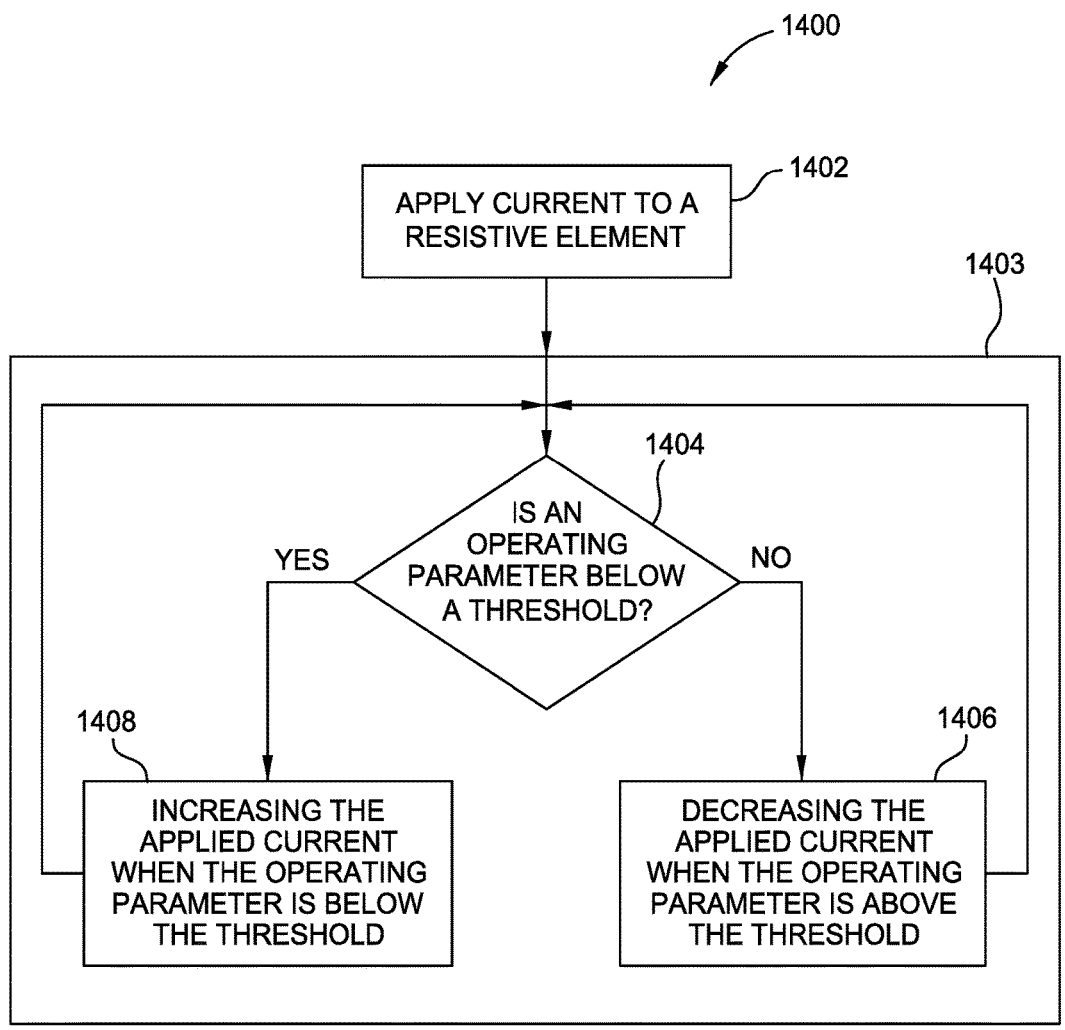
FIG. 14 illustrates a method of monitoring and adjusting resistance in the resistive element thermally couple to the optical detector, according to one embodiment disclosed herein.

FIG. 14 illustrates a method 1400 of monitoring and adjusting resistance in the resistive element 312 thermally coupled to the optical detector 215, according to one embodiment disclosed herein. The control circuit 314 applies a current to the resistive element 312 at block 1402. At block 1403, the applied current to the resistive element 312 is adjusted based on a comparison between an operating parameter and a threshold. In one embodiment, block 1403 includes blocks 1404, 1406, and 1408.

At block 1404, the applied current is compared to a current value stored in a look-up table stored in memory. As explained above, the look-up table stores operating parameters for the resistive element 312. The applied current is compared to current values stored in the look-up table. Other data stored in the look-up table, may include the voltage, resistance, and/or temperature of the resistive element 312 associated with that stored current. The other data may be accessed without having to perform a calculation (i.e., acquire the voltage, the resistance and/or temperature without an equation). In one embodiment, when temperature is the operating parameter, the temperature in the look-up table that is associated with the applied current is the threshold.

At block 1406, the current through the resistive element is decreased if at block 1404 it is determined that the temperature from the look-up is above the threshold. Blocks 1404 and 1406 act as an iterative loop that monitors and adjusts the temperature of the resistive element 312 by decreasing the applied current when needed.

If, however, it is determined at block 1404 that the associated temperature in the look-up table is below the threshold then, at block 1408, the applied current is increased. Blocks 1404 and 1408 act as an iterative loop that monitors and adjusts the temperature of the resistive element 312 by increasing the applied current when needed.

In another embodiment of method 1400, the control circuit 314 applies a current to the resistive element 312 at block 1402. However, at block 1404 the temperature of an additional (i.e., different) resistive element (or any other type of temperature sensor) is monitored. The different resistive element is thermally coupled to the resistive element 312 and the optical detector 215. At block 1404, the temperature of the different resistive element is used as a temperature sensor for the resistive element 312. In one embodiment, the temperature of the different resistive element is compared to a threshold temperature stored in the look-up table. If the temperature of the different resistive element is above the threshold temperature then at block 1406 the current through the resistive element 312 is decreased. Blocks 1404 and 1406 act as an iterative loop that monitors and adjusts the temperature of the different resistive element by decreasing the applied current through the resistive element 312 when needed. If, however, temperature of the different resistive element is below the threshold temperature then, at block 1408, the applied current through the resistive element 312 is increased. Blocks 1404 and 1408 act as an iterative loop that monitors and adjusts the temperature of the different resistive element by increasing the applied current through the resistive element 312 when needed.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:
1. A photonic system, comprising:
  a silicon substrate that includes a waveguide, wherein the silicon substrate has a polygon shaped geometry comprising multiple sides;
  an optical detector optically coupled to the waveguide, the optical detector comprising:
    a germanium layer disposed on the silicon substrate; and
    a plurality of electrical contacts contacting at least one of the silicon substrate and the germanium layer;
  a resistive element thermally coupled to the optical detector such that a current flowing through the resistive element controls a temperature of the optical detector, the resistive element comprising at least two sides that are adjacent to at least two respective sides of the multiple sides of the silicon substrate; and
  a bridge that couples the respective adjacent sides of the resistive element and the silicon substrate.

2. The system of claim 1 further comprising at least one silicon bridge coupling the silicon substrate to the resistive element.

3. The system of claim 1 wherein the resistive element is disposed on the silicon substrate.

4. The system of claim 1 wherein,
  the silicon substrate has a polygon shaped geometry that includes at least four sides; and
  the resistive element includes multiple sides that are adjacent to at least one side of the silicon substrate.

5. The system of claim 1 wherein the silicon substrate includes at least one other waveguide, the at least one other waveguide comprises one of silicon and silicon nitride.

6. The system of claim 5 further comprising at least one additional resistive element thermally coupled to the optical detector such that a current flowing through the at least one additional resistive element affects the temperature of the optical detector.

7. A photonic system, comprising:
  a silicon substrate that includes a waveguide and at least one other waveguide, wherein the at least one other waveguide comprises one of silicon and silicon nitride, wherein the silicon substrate has a polygon shape that includes a plurality of sides that form at least three corners, and wherein the waveguide and the at least one other waveguide are arranged on the plurality of sides of the silicon substrate in a configuration that is one of symmetrical and asymmetrical;
  an optical detector optically coupled to the waveguide, the optical detector comprising:
    a germanium layer disposed on the silicon substrate, wherein the germanium layer is rotated such that corners of the germanium layer are aligned with the waveguides; and
    a plurality of electrical contacts contacting at least one of the silicon substrate and the germanium layer, wherein a set of some electrical contacts in the plurality of electrical contacts are symmetrically arranged at the corners of the silicon substrate; and
  a resistive element thermally coupled to the optical detector such that a current flowing through the resistive element controls a temperature of the optical detector; and
  at least one additional resistive element thermally coupled to the optical detector such that a current flowing through the at least one additional resistive element affects the temperature of the optical detector, wherein the resistive element and the additional resistive element are each aligned with a respective corner of the silicon substrate.

8. The system of claim 1 wherein the waveguide comprises one of silicon nitride, silicon oxy-nitride, and poly-silicon.

9. The system of claim 1 wherein,
the silicon substrate has a geometric shape that is one of a closed plane curve and a polygon, and
the germanium layer has a geometric shape that is one of a closed plane curve and a polygon.

10. A photonic system, comprising:
a substrate that includes at least one waveguide comprising silicon, wherein the substrate has a geometric shape that is one of a closed plane curve and a polygon;
an optical detector optically coupled to the at least one waveguide, the optical detector comprising a germanium layer disposed on the substrate, wherein the germanium layer has a geometric shape that is one of a closed plane curve and a polygon; and
at least one resistive element thermally coupled to the optical detector such that a current flowing through the resistive element controls a temperature of the optical detector.

11. The system of claim 10 further comprising at least one bridge coupling the substrate to the at least one resistive element.

12. The system of claim 11 wherein,
the substrate has a polygon shape and multiple sides,
the at least one resistive element includes multiple sides that are adjacent to at least two of the multiple sides of the substrate, and
the at least one bridge is a plurality of bridges that couples the multiple sides of the at least one resistive element to the at least two of the multiple sides of the substrate.

13. The system of claim 12 wherein,
the at least one waveguide includes at least two waveguides positioned symmetrically on the substrate,
the at least one resistive element includes at least two resistive elements positioned symmetrically around the substrate,
electrical contacts are positioned symmetrically on the optical detector; and
further comprising at least two silicon bridges coupling the substrate to the at least two resistive elements.

* * * * *

UNITED STATES PATENT AND TRADEMARK OFFICE
CERTIFICATE OF CORRECTION

PATENT NO. : 10,446,699 B2
APPLICATION NO. : 15/663556
DATED : October 15, 2019
INVENTOR(S) : Igal I. Bayn et al.

It is certified that error appears in the above-identified patent and that said Letters Patent is hereby corrected as shown below:

In the Claims

In Column 12, Line 51, in Claim 7, after "of" delete "some".

Signed and Sealed this
Fourteenth Day of January, 2020

Andrei Iancu
*Director of the United States Patent and Trademark Office*